(12) United States Patent
Chen

(10) Patent No.: US 7,326,633 B2
(45) Date of Patent: Feb. 5, 2008

(54) ANISOTROPIC CONDUCTIVE FILM

(75) Inventor: Ga-Lane Chen, Fremont, CA (US)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 80 days.

(21) Appl. No.: 11/228,943

(22) Filed: Sep. 16, 2005

(65) Prior Publication Data
US 2006/0113511 A1 Jun. 1, 2006

(30) Foreign Application Priority Data
Nov. 26, 2004 (TW) .............................. 93136497 A

(51) Int. Cl.
*H01L 21/20* (2006.01)
(52) U.S. Cl. .................. 438/584; 977/743; 977/753; 977/770; 977/846
(58) Field of Classification Search ................ 438/584; 977/743, 846, 770, 753
See application file for complete search history.

(56) References Cited

U.S. PATENT DOCUMENTS

| 5,686,703 | A | 11/1997 | Yamaguchi |
| 6,042,894 | A | 3/2000 | Goto et al. |
| 6,451,875 | B1 | 9/2002 | Suga et al. |
| 6,632,380 | B1 * | 10/2003 | Wessling ................. 252/500 |
| 6,884,833 | B2 * | 4/2005 | Chheang et al. ............. 524/445 |
| 2005/0116202 | A1 * | 6/2005 | Gao et al. ................... 252/500 |

OTHER PUBLICATIONS

J. Bao, C. Tie, Z. Xu, Z. Suo, Q. Zhou, J. Hong, Advanced Materials, vol. 14, Issue 20, pp. 1483-1486.*
A. Huczko; Applied Physics A: Materials Science & Processing; vol. 70, No. 4 / Apr. 2000.*
A. Chu, J. Cook, R.J.R. Heesom, J.L. Hutchison, M.L.H. Green, J. Sloan: Chem. Mater. 8, 2751 (1996).*

* cited by examiner

*Primary Examiner*—Fernando L. Toledo
*Assistant Examiner*—Jarrett J Stark
(74) *Attorney, Agent, or Firm*—Jeffrey T. Knapp

(57) ABSTRACT

An anisotropic conductive film (10) is used for bonding a semiconductor component to a circuit board. The anisotropic conductive film includes an insulative adhesive film (12) and a plurality of nano-scaled conductive particles (14). The nano-scaled conductive particles are dispersed in the insulative adhesive film. The nano-scaled conductive particles are a nanotubes each containing metal particles and polyaniline therein. Because the sizes of the nano-scaled conductive particle are very small, more of the nano-scaled conductive particles can be compressed between two corresponding contacts of the semiconductor component and the circuit board. The interface area between the two corresponding contacts is correspondingly enlarged. In addition, the polyaniline both in the opening and inside of the nanotubes also has a more favorable viscosity. The bonding effect between a semiconductor component and a circuit board is improved.

11 Claims, 3 Drawing Sheets

ANISOTROPIC CONDUCTIVE FILM

BACKGROUND OF THE INVENTION

1. Field of the Invention

The present invention relates to anisotropic conductive films used for electronically and mechanically bonding together electronic components, such as semiconductor components and circuit boards.

2. Discussion of the Related Art

To bond pins of a semiconductor component and circuits of a circuit board together, an anisotropic conductive film (ACF) generally is used. Generally, the anisotropic conductive film includes an insulative adhesive film and a plurality of conductive particles uniformly dispersed therein. In use, the anisotropic conductive film is compressed between the semiconductor component and the circuit board. The pins of the semiconductor component, in turn, are aligned with and face the circuits of the circuit board. Upon compression of the anisotropic conductive film, the conductive particles therein allow the pins of the semiconductor component to electrically connect the circuits of the circuit board. The adhesive film thus mechanically bonds the semiconductor component and the circuit board together, and the adhesive film further serves as an insulative overcoating, covering joint portions between the semiconductor component and the circuit board.

The conductive particles play an important role in bonding the semiconductor component and the circuit board together. Various conductive particles used in the anisotropic conductive film have also been developed. For example, an anisotropic conductive film is disclosed in U.S. Pat. No. 5,686,703. In this case, metal particles such as nickel particles, aluminum particles, and silver particles are used. Another anisotropic conductive film is disclosed in U.S. Pat. No. 6,042,894, displaying plastic particles coated with a metal film. Yet another anisotropic conductive film is disclosed in U.S. Pat. No. 6,451,875, in which macromolecule particles coated with a metal film are used.

However, sizes of above-mentioned conductive particles are at a scale of about a micrometer. The sizes of the pins/contacts of the semiconductor component and the circuits of the circuit board are very small. Therefore, an amount of the micrometer-scaled conductive particles that are compressed between pins/contacts of the semiconductor component and a corresponding circuit of the circuit board is limited. A contact interface between the pins/contacts of the semiconductor component and the corresponding circuit of the circuit board also is small. Thus, the anisotropic conductive film with micrometer-scale conductive particles generally cannot provide a satisfactory bonding between the semiconductor component and the circuit board.

What is needed, therefore, is an anisotropic conductive film with conductive particles that are configured for providing an improved bonding ability.

SUMMARY OF THE INVENTION

An anisotropic conductive film according to one preferred embodiment includes an insulative adhesive film and a plurality of nano-scaled conductive particles. The nano-scaled conductive particles are dispersed in the insulative adhesive film.

Advantageously, the nano-scaled conductive particle can be nanotubes containing metal particles and polyaniline therein.

Compared with conventional anisotropic conductive films with micro-scaled conductive particles, the present anisotropic conductive film has nano-scaled conductive particles therein. The amount of the nano-scaled conductive particles that can be compressed and thereby disposed between two corresponding contacts is significantly increased, when compared to the use of micro-particles. The conductive interface area between the two corresponding contacts is correspondingly enlarged. In addition, the polyaniline, carried in the opening and inside of the nano-scaled conductive particles, also has a better, more favorable viscosity, resulting in improved flow distribution thereof. The bonding effect between a semiconductor component and a circuit board is consequently improved.

Other advantages and novel features will become more apparent from the following detailed description of preferred embodiments when taken in conjunction with the accompanying drawings.

BRIEF DESCRIPTION OF THE DRAWINGS

Many aspects of the anisotropic conductive film can be better understood with reference to the following drawings. The components in the drawings are not necessarily to scale, the emphasis instead being placed upon clearly illustrating the principles of the present anisotropic conductive film. Moreover, in the drawings, like reference numerals designate corresponding parts throughout the several views.

DETAILED DESCRIPTION OF PREFERRED EMBODIMENTS

Reference will now be made to the drawings to describe preferred embodiments of the present anisotropic conductive film in detail.

Figure 1:
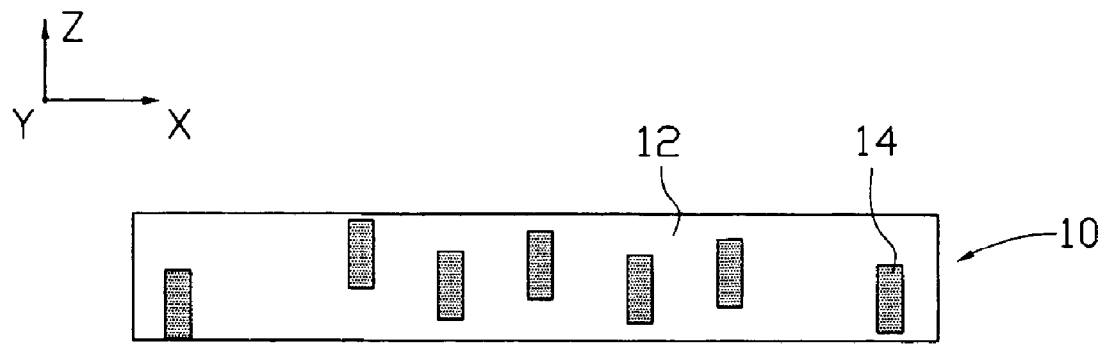
FIG. 1 is a schematic, side cross-sectional view of an anisotropic conductive film in accordance with a preferred embodiment.

Referring to FIG. 1, an anisotropic conductive film 10 in accordance with a preferred embodiment is shown. The anisotropic conductive film 10 includes an insulative adhesive film 12 and a plurality of nano-scaled conductive particles 14 (formed of, e.g., carbon or copper). The nano-scaled conductive particles 14 are dispersed in the adhesive film 12. Advantageously, the nano-scaled conductive particles 14 are concentrated proximate a single primary (non-edge) surface of film 10 to better control the electrical isolation thereof except where selected electrical contacts are desired.

The adhesive film 12 can be made of, e.g. an epoxy resin, a phenol-aldehyde resin, a hydroxyl polyester resin, a hydroxyl acrylic acid resins, and/or another suitable insulative resin, each being curable by heating or ultraviolet irradiation. In view of the curing temperature, curing time, and stability of the adhesive film 12, the adhesive film 12 is preferably composed, at least substantially, of one or more type of epoxy resins. The epoxy resins can advantageously be selected from the group consisting of bisphenol-aldehyde epoxy resin, a phenol-aldehyde resin (for use in an epoxy paint), and an epoxy compound having at least two ethylene oxide groups contained in a molecular thereof. In addition, the adhesive film 12 can further include a hardening agent.

Each nano-scaled conductive particle 14, usefully, is a nanotube containing metal particles and polyaniline therein. The nanotube can itself be formed, for example, of carbon, a metal (such as copper), or other sufficiently conductive material and may be a multi-walled nanotube or a single-walled nanotube. The nanotube has at least one open end, so that the metal particles and polyaniline can be introduced into the nanotube therethrough. The metal particles are composed, at least substantially, of a least one material selected from the group consisting of gold, silver, copper, nickel, and iron. The polyaniline has a good electrical conductivity and adhesive ability. The structural formula of the polyaniline is shown as follows:

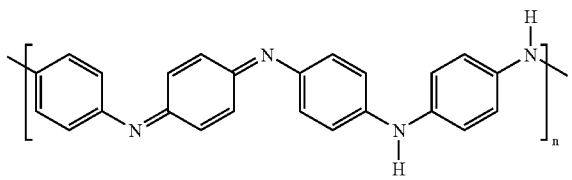

In addition, the hydrogen atoms in the molecular chain of the polyaniline can be replaced by metal ions, such as copper ions, iron ions, nickel ions, or gold ions, etc. Thus, a polyaniline with metal ions (i.e., metallic polyaniline) is obtained. The electrical conductivity and adhesive ability of the polyaniline with metal ions is better than that of the polyaniline. The structural formula of the polyaniline with metal ions is shown as follows (wherein, A represents metal ion):

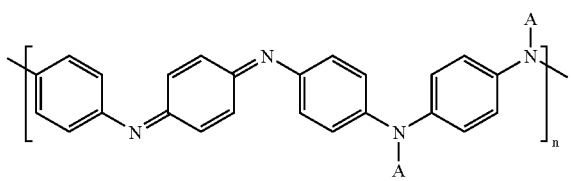

Figure 2:
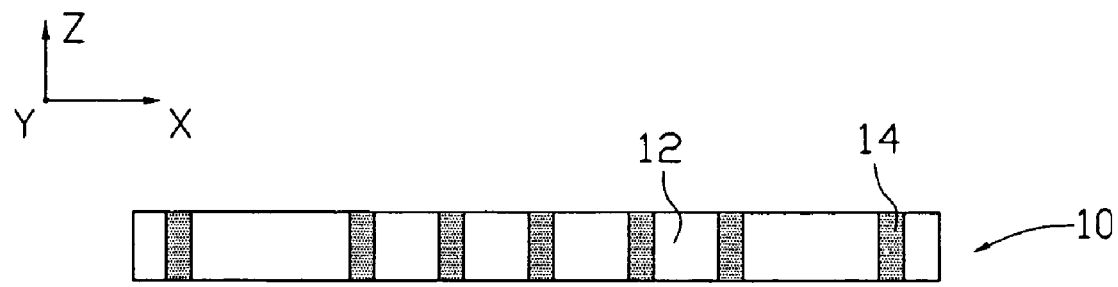
FIG. 2 is a schematic, side cross-sectional view of the anisotropic conductive film of FIG. 1, showing the anisotropic conductive film in use.

In use of the anisotropic conductive film 10, pins of the semiconductor component and the circuit board are arranged to face and align with each other. The anisotropic conductive film 10 is applied and compressed between the semiconductor component and the circuit board. Referring to FIG. 2, upon the anisotropic conductive film 10 being compressed, the nano-scaled conductive particles 14 provide an electrically conductive connection between the pins or contacts of the semiconductor component and the circuit board in Z-axis direction. In addition, the pins of the semiconductor component in X-axis and Y-axis directions are electrically insulated from each other. That is, any neighboring two pins of the semiconductor component are electrically insulated from each other.

The pins of the component remain insulated in those directions due to the thickness of adhesive film 12 generally far exceeding that of the deposits of nano-scaled conductive particles 14. Further, separate deposits of nano-scaled conductive particles 14 remain insulated from one another due to the presence of the material of adhesive film 12 therebetween. Only in those locations where the pins or contacts of the component and/or board have expressly been compressed into contact with the nano-scaled conductive particles 14 has electrical connectivity been established. In those locations the adhesive film 12 has been substantially displaced, thereby permitting an electrical connection to be formed between selected nano-scaled conductive particles 14 and corresponding pins and/or contacts.

Figure 3:
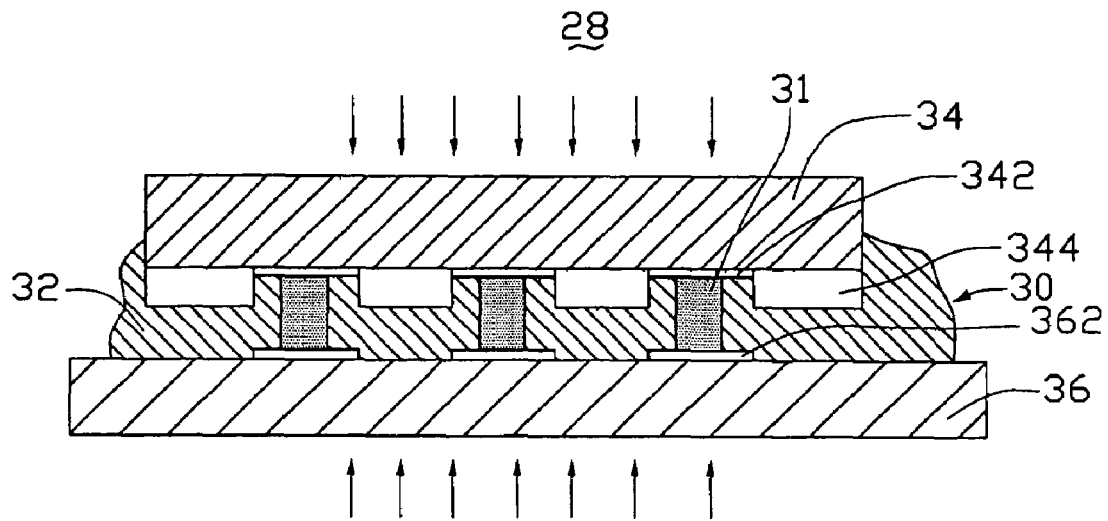
FIG. 3 is a schematic, side cross-sectional view of a bonding structure of a semiconductor component and a circuit board using an anisotropic conductive film in accordance with a first exemplary embodiment.

Referring to FIG. 3, a bonded structure of a semiconductor component and a circuit board using an anisotropic conductive film in accordance with a first exemplary embodiment is shown. The bonded structure 28 includes a semiconductor component 34, a circuit board 36, and an anisotropic conductive film 30. The anisotropic conductive film 30 includes an insulative film 32 advantageously made of a resin and a plurality of nano-scaled conductive particles 31.

A plurality of contacts 342 is formed on an outer surface of the semiconductor component 34. A passive film 344, formed on the surface of the semiconductor component 34, surrounds the electrodes 342. A thickness of each of the contacts 342 is smaller than that of the passive film 344. The contacts 342 are generally made of metals, such as aluminum, copper, etc., known to be good conductors of electricity. The passive film 344 can be made of resins such as polyimide resin, phenylene cyclobutene, etc. The circuit board 36 includes a plurality of contacts 362, respectively corresponding to the contacts 342 of the semiconductor component 34. The circuit board 36 may be a resin substrate, a glass substrate, a printed circuit board, or a flexible printed circuit board. The contacts 362 of the circuit board 36 may be a metallic conductor such as aluminum, copper, etc.

The semiconductor component 34 and the circuit board 36 are respectively pressed along the directions of the arrows and then are externally heated. By compressing and heating the anisotropic conductive film, the insulative resin 32 is melted and therefore deformable. Thus, selected nano-scaled conductive particles 31 provide an electrically conductive interface between the component contacts 342 of the semiconductor component 34 and the board contacts 362 of the circuit board 36, respectively. Then, the insulative resin 32 and the polyaniline are cured, for example, by laser irradiation or ultraviolet irradiation. Because the size of the nano-scaled conductive particle 31 is very small, therefore, compared to the conventional micro-scaled conductive particles, more of the nano-scaled conductive particles 31 can be disposed and compressed between two corresponding contacts 342 and 362. The conductive interface area between the two corresponding contacts 342 and 362 is consequently enlarged. In addition, the polyaniline contained by (i.e., in the opening and inside thereof) the nano-scaled conductive particles 31 also has a better, more favorable viscosity. The bonding effect of the semiconductor component 34 and the circuit board 36 is thereby improved.

Figure 4A:
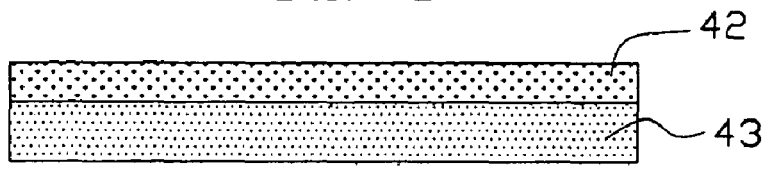
FIGS. 4A to 4F are schematic, side cross-sectional views showing successive stages in a method of forming an anisotropic conductive film, in accordance with a second exemplary embodiment, and bonding a semiconductor chip to a circuit board using the anisotropic conductive film.
Figure 4B:
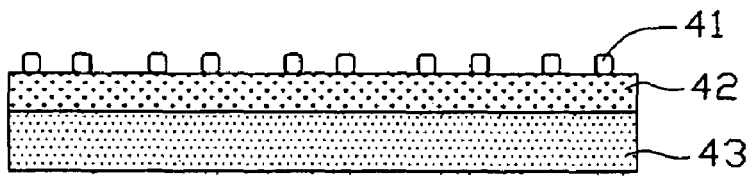

Referring to FIGS. 4A to 4F, successive stages in a method for forming an anisotropic conductive film in accordance with a second exemplary embodiment, and the subsequent bonding of a semiconductor chip to a circuit board using the anisotropic conductive film are shown. The method includes the steps of:

(a) as shown in FIG. 4A, forming a layer of an adhesive film 42 on a surface of a resin film 43, wherein the adhesive film 42 and the resin film 43 cooperatively function as a protective film;

(b) as shown in FIG. 4B, dispersing a plurality of nano-scaled conductive particles 41 on a surface of the adhesive film 42, wherein the nano-scaled conductive particles 41 are affixed on that surface of the adhesive film 42.

Figure 4C:
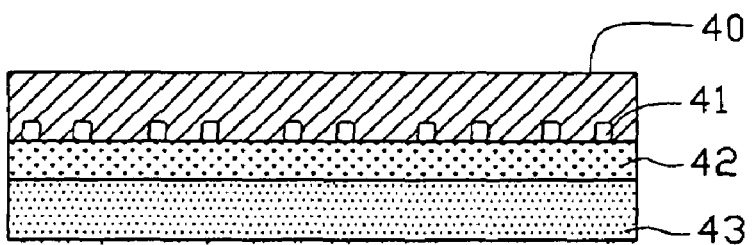
Figure 4D:
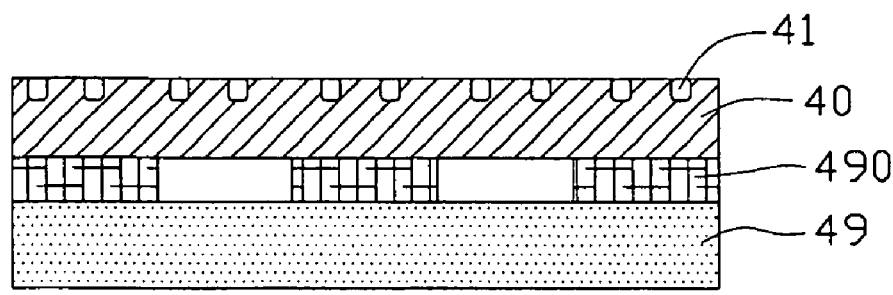
Figure 4E:
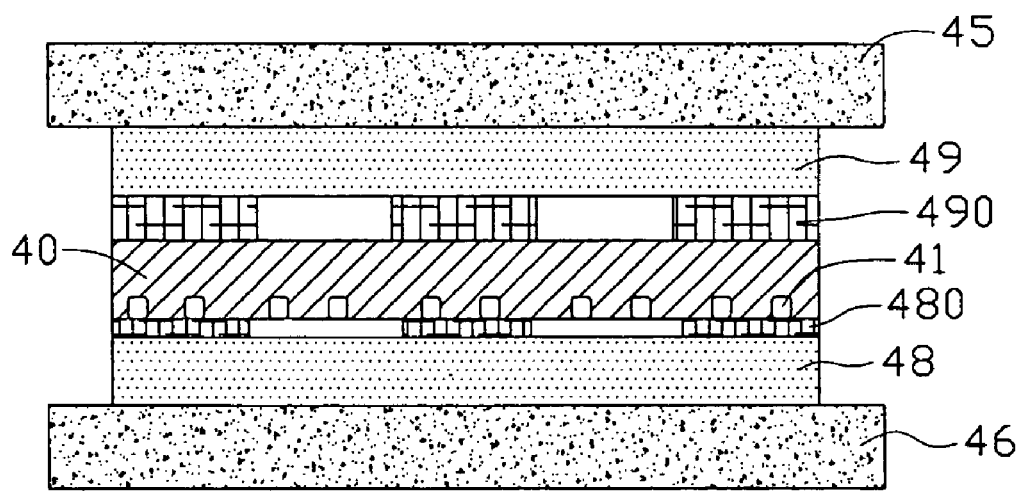
Figure 4F:
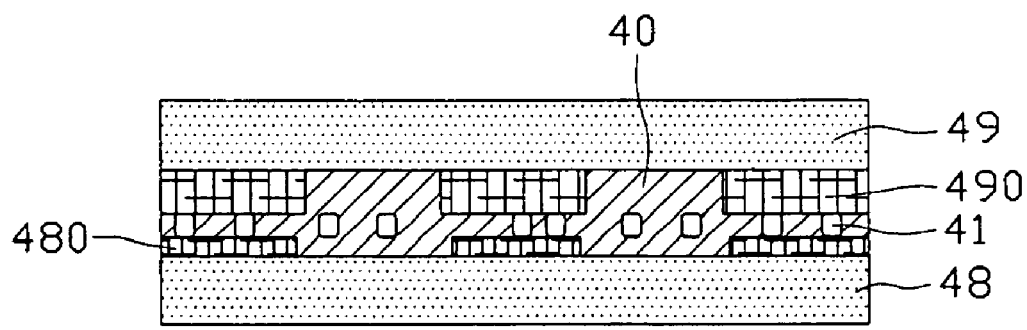

(c) as shown in FIG. 4C, forming a layer of an insulative adhesive film 40 on the surface of the adhesive film 42, wherein the nano-scaled conductive particles 41 are dispersed in the insulative adhesive film 40, the nano-scaled conductive particles 41 thereby being generally proximate the face of the insulative adhesive film 40 originally formed adjacent the adhesive film 42;

(d) as shown in FIG. 4D, removing the adhesive film 42 and the resin film 43, and placing the insulative adhesive film 40, carrying the nano-scaled conductive particles 41, on a surface of a semiconductor chip 49, the chip surface having a plurality of bumps 490 thereon;

(e) as shown in FIG. 4E, aligning the bumps 490 with respective contacts 480 of a circuit board 48, then pressing and heating the semiconductor chip 49 and the circuit board 48 using two clamping plates 45 and 46, corresponding contacts 480 and bumps 490 each thereby coming into mutual contact with selected nano-scaled conductive particles 41; and (f) as shown in FIG. 4F, after having brought the bumps 490 into electrical contact with respective contacts 480 via selected nano-scaled conductive particles 41, curing the insulative adhesive film 40, thereby bonding the semiconductor chip 49 and the circuit board 48 together.

It is to be understood that the above-described embodiments are intended to illustrate rather than limit the invention. Variations may be made to the embodiments without departing from the spirit of the invention as claimed. The above-described embodiments are intended to illustrate the scope of the invention and not restrict the scope of the invention.

What is claimed is:

1. An anisotropic conductive film, comprising an insulative adhesive film and a plurality of nano-scaled conductive particles, the nano-scaled conductive particles being dispersed in the insulative adhesive film, the nano-scaled conductive particles comprising nanotubes each containing metal particles and polyaniline therein, the polyaniline having at least one of hydrogen atoms and metal ions in its molecular chain.

2. The anisotropic conductive film as claimed in claim 1, wherein the metal ions are comprised of ions selected from the group consisting of copper ions, iron ions, nickel ions, and gold ions.

3. The anisotropic conductive film as claimed in claim 1, wherein the metal particles are comprised of at least one metal selected from the group consisting of gold, silver, copper, nickel, and iron.

4. The anisotropic conductive film as claimed in claim 1, wherein the adhesive film is a curable, insulative resin.

5. The anisotropic conductive film as claimed in claim 4, wherein the insulative resin is comprised of at least one material selected from the group consisting of an epoxy resin, a phenol-aldehyde resin, a hydroxyl polyester resin, and a hydroxyl acrylic acid resin.

6. The anisotropic conductive film as claimed in claim 1, wherein the adhesive further comprises a hardening agent mixed therein.

7. The anisotropic conductive film as claimed in claim 1, wherein each nanotube is one of a multi-walled nanotube and a single-walled nanotube.

8. A bonded structure, comprising:
   a semiconductor component with a plurality of component contacts formed on an outer surface thereof;
   a circuit board with a plurality of board contacts respectively corresponding to the component contacts; and
   an anisotropic conductive film sandwiched between the semiconductor component and the circuit board, the anisotropic conductive film being comprised of an insulative adhesive film and a plurality of nano-scaled conductive particles, the nano-scaled conductive particles being dispersed in the insulative adhesive film, the nano-scaled conductive particles comprising nanotubes each containing metal particles and polyaniline therein, the polyaniline having at least one of hydrogen atoms and metal ions in its molecular chain.

9. The bonded structure as claimed in claim 8, wherein selected nano-scaled conductive particles provide an electrically conductive interface between respective pairs of the component contacts and the board contacts.

10. The bonded structure as claimed in claim 8, wherein the component contacts of the semiconductor component and the board contacts of the circuit board are arranged to face and align with each other, and the nano-scaled conductive particles respectively provide an electrically conductive connection between the component contacts of the semiconductor component and the aligned board contacts of the circuit board.

11. The bonded structure as claimed in claim 8, wherein the neighboring two component contacts of the semiconductor component are electrically insulated from each other.

* * * * *